United States Patent
Hu et al.

[11] Patent Number: 6,127,270
[45] Date of Patent: Oct. 3, 2000

[54] METHODS OF FORMING REFRACTORY METAL SILICIDE COMPONENTS AND METHODS OF RESTRICTING SILICON SURFACE MIGRATION OF A SILICON STRUCTURE

[75] Inventors: Yongjun Hu; Jigish D. Trivedi, both of Boise, Id.

[73] Assignee: Micron Technology, Inc., Boise, Id.

[21] Appl. No.: 08/910,908

[22] Filed: Aug. 13, 1997

[51] Int. Cl.[7] .................................................. H01L 21/44
[52] U.S. Cl. ........................... 438/683; 438/624; 438/635; 438/656; 438/664; 438/688; 438/760; 438/763; 438/768; 438/783
[58] Field of Search ..................................... 438/627, 643, 438/653, 654, 655, 660, 663, 624, 635, 656, 664, 688, 760, 763, 768, 783, 683

[56] References Cited

U.S. PATENT DOCUMENTS

| | | | |
|---|---|---|---|
| 4,567,058 | 1/1986 | Koh | 427/55 |
| 5,196,360 | 3/1993 | Doan et al. | 437/41 |
| 5,306,951 | 4/1994 | Lee et al. | 257/755 |
| 5,389,575 | 2/1995 | Chin et al. | 437/190 |
| 5,508,212 | 4/1996 | Wang et al. | 437/24 |
| 5,597,744 | 1/1997 | Kamiyama et al. | 438/285 |
| 5,614,437 | 3/1997 | Choudhury | 438/627 |
| 5,633,200 | 5/1997 | Hu | 438/653 |
| 5,741,721 | 4/1998 | Stevens | 438/635 |
| 5,741,725 | 4/1998 | Inoue et al. | 437/200 |
| 5,776,831 | 7/1998 | Padmanabhan et al. | 438/653 |
| 5,856,237 | 1/1999 | Ku | 438/683 |

OTHER PUBLICATIONS

A. E. Morgan et al., "Interactions of thin Ti films with Si, $SiO_2$, $Si_3N_4$, and $SiO_xN_y$ under rapid thermal anealing", J. Appl. Phys., vol. 64, No. 1, Jul. 1988, pp. 344–353.

*Primary Examiner*—David Nelms
*Assistant Examiner*—Reneé R. Berry
*Attorney, Agent, or Firm*—Wells, St. John, Roberts, Gregory & Matkin P.S.

[57] ABSTRACT

Methods of forming refractory metal silicide components are described. In accordance with one implementation, a refractory metal layer is formed over a substrate. A silicon-containing structure is formed over the refractory metal layer and a silicon diffusion restricting layer is formed over at least some of the silicon-containing structure. The substrate is subsequently annealed at a temperature which is sufficient to cause a reaction between at least some of the refractory metal layer and at least some of the silicon-containing structure to at least partially form a refractory metal silicide component. In accordance with one aspect of the invention, a silicon diffusion restricting layer is formed over or within the refractory metal layer in a step which is common with the forming of the silicon diffusion restricting layer over the silicon-containing structure. In a preferred implementation, the silicon diffusion restricting layers are formed by exposing the substrate to nitridizing conditions which are sufficient to form a nitride-containing layer over the silicon-containing structure, and a refractory metal nitride compound within the refractory metal layer. A preferred refractory metal is titanium.

34 Claims, 5 Drawing Sheets

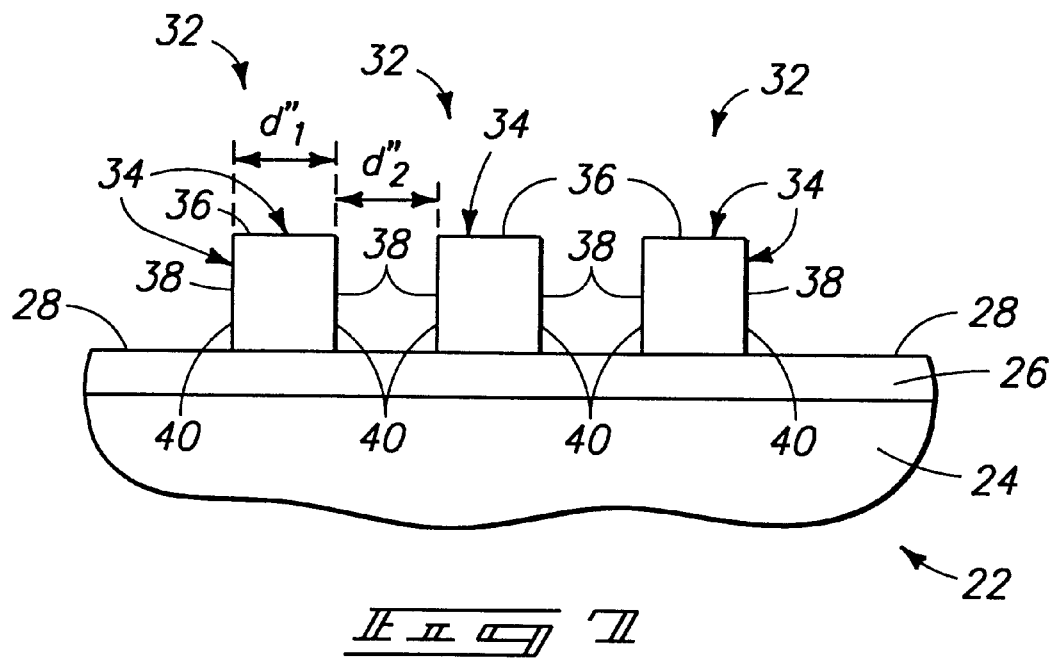
_Fig. 7_
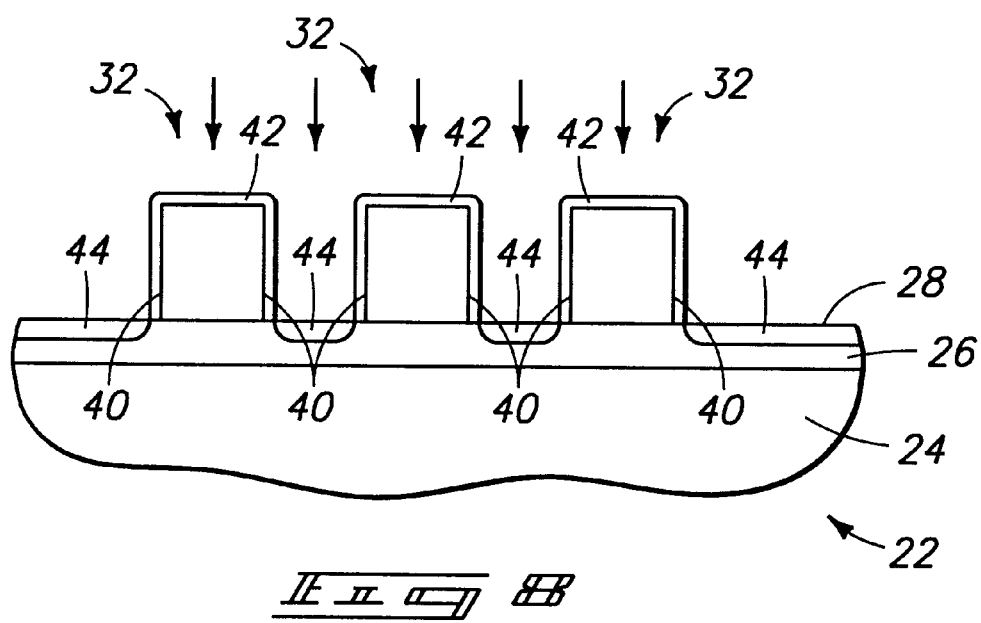
_Fig. 8_

METHODS OF FORMING REFRACTORY METAL SILICIDE COMPONENTS AND METHODS OF RESTRICTING SILICON SURFACE MIGRATION OF A SILICON STRUCTURE

PATENT RIGHTS STATEMENT

This invention was made with Government support under Contract No. MDA972-92-C-0054 awarded by Advanced Research Projects Agency (ARPA). The Government has certain rights in this invention.

TECHNICAL FIELD

This invention relates to methods of forming refractory metal silicide components and methods of restricting silicon surface migration of an etched silicon structure relative to a surface of an underlying refractory metal layer.

BACKGROUND OF THE INVENTION

Fabrication of semiconductor devices involves forming electrical interconnections between electrical components on a wafer. Electrical components include transistors and other devices which can be fabricated on the wafer. One type of electrical interconnection comprises a conductive silicide line the advantages of which include higher conductivities and accordingly, lower resistivities.

Typically, conductive silicide components can be formed by blanket depositing a layer of refractory metal over the wafer and then blanket depositing a layer of silicon over the refractory metal layer. For example, referring to FIG. 1, an exemplary wafer fragment in process is shown generally at 10 and includes a substrate 12. Exemplary materials for substrate 12 comprise suitable semiconductive substrate materials and/or other insulative materials such as $SiO_2$. As used is this document, the term "semiconductive substrate" will be understood to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. A refractory metal layer 14 is formed over substrate 12 followed by formation of a layer 16 of silicon.

Referring to FIG. 2, layer 16 is patterned and etched to form a plurality of silicon-containing structures 17. Silicon-containing structures 17 constitute structures from which electrical interconnects are to be formed relative to wafer 10. The etching of the silicon-containing structures defines a silicon-containing structure dimension $d_1$ and a silicon-containing structure separation distance $d_2$. In the illustrated example, $d_1$ is substantially equal to $d_2$. Such relationship between $d_1$ and $d_2$ results from a desire to use as much of the wafer real estate as is available. Accordingly, the spacing between the silicon-containing structures reflects a critical dimension which is a function of the limitations defined by the photolithography technology available. The goal is to get the silicon-containing structures as close as possible to conserve wafer real estate.

Referring to FIG. 3, substrate 12 is exposed to suitable conditions to cause a reaction between the refractory metal layer 14 and the silicon-containing structures 17. Typical conditions include a high temperature annealing step conducted at a temperature of about 675° C. for about 40 seconds. Subsequently, the unreacted refractory metal is stripped from the wafer. The resulting refractory metal silicide components or lines are illustrated at 18 where the resulting line dimensions $d_1'$ can be seen to be larger than the silicon-containing structure dimensions $d_1$ (FIG. 2) from which each was formed. Accordingly, the relative spacing or separation between the lines is illustrated at $d_2'$. With the attendant widening of the silicide components or lines, the separation distance between them is correspondingly reduced. A major cause of this widening is the diffusive nature of the silicon from which the FIG. 2 silicon-containing structures are formed. That is, because silicon is highly diffusive in nature, the formation of the FIG. 3 silicide components causes a surface migration of the silicon relative to the underlying substrate. In the past, when device dimensions were larger, the migration of silicon during silicide formation was not a problem. Adequate spacing between the resulting silicide lines ensured that there would be much less chance of two or more components shorting together. However, as device dimensions grow smaller, particularly at the 0.35 μm generation and beyond, there is an increased chance of shorting. This is effectively illustrated in FIG. 4 where two refractory metal components 19 can be seen to engage one another and hence short together at 20.

This invention grew out of concerns associated with forming silicide components. This invention also grew out of concerns associated with improving the integrity of electrical interconnections as device dimensions grow ever smaller.

SUMMARY OF THE INVENTION

Methods of forming refractory metal silicide components are described. In accordance with one implementation, a refractory metal layer is formed over a substrate. A silicon-containing structure is formed over the refractory metal layer and a silicon diffusion restricting layer is formed over at least some of the silicon-containing structure. The substrate is subsequently annealed at a temperature which is sufficient to cause a reaction between at least some of the refractory metal layer and at least some of the silicon-containing structure to at least partially form a refractory metal silicide component. In accordance with one aspect of the invention, a silicon diffusion restricting layer is formed over or within the refractory metal layer in a step which is common with the forming of the silicon diffusion restricting layer over the silicon-containing structure. In a preferred implementation, the silicon diffusion restricting layers are formed by exposing the substrate to nitridizing conditions which are sufficient to form a nitride-containing layer over the silicon-containing structure, and a refractory metal nitride compound within the refractory metal layer. A preferred refractory metal is titanium.

BRIEF DESCRIPTION OF THE DRAWINGS

Preferred embodiments of the invention are described below with reference to the following accompanying drawings.

FIG. 7 is a view of the FIG. 5 wafer fragment at a processing step subsequent to that shown by FIG. 6.

FIG. 8 is a view of the FIG. 5 wafer fragment at a processing step subsequent to that shown by FIG. 7.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
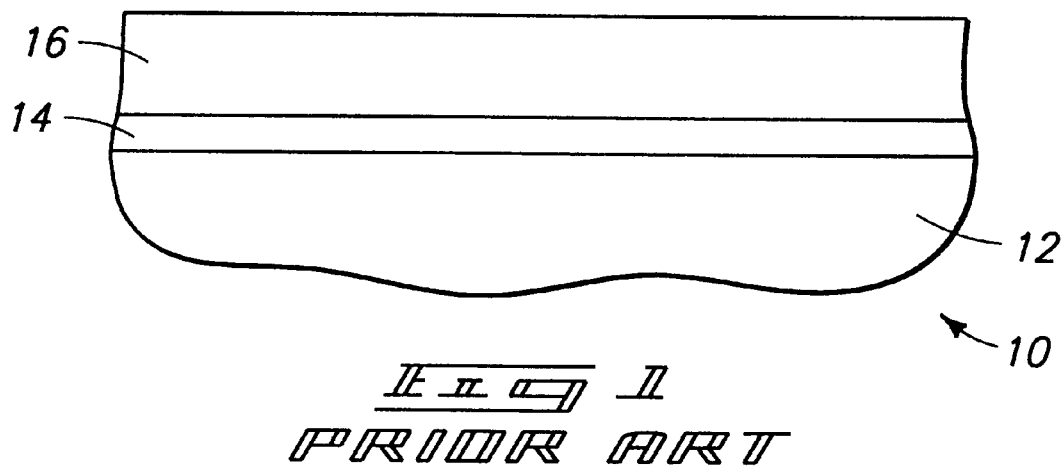
FIG. 1 is a diagrammatic sectional view of a semiconductor wafer fragment at one prior art processing step.
Figure 2:
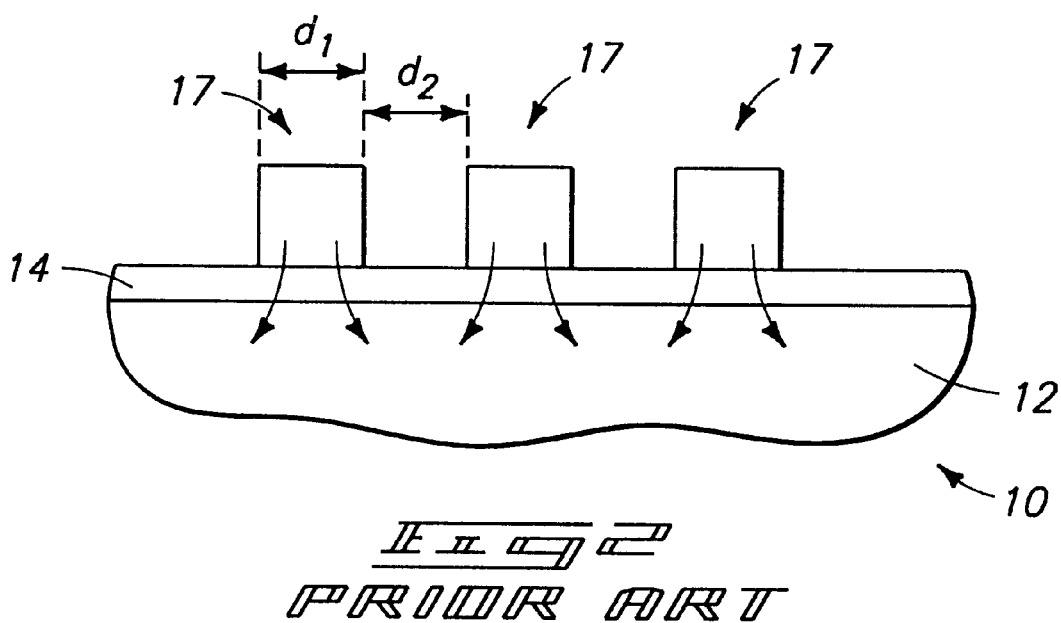
FIG. 2 is a view of the FIG. 1 wafer fragment at a processing step subsequent to that shown by FIG. 1.
Figure 3:
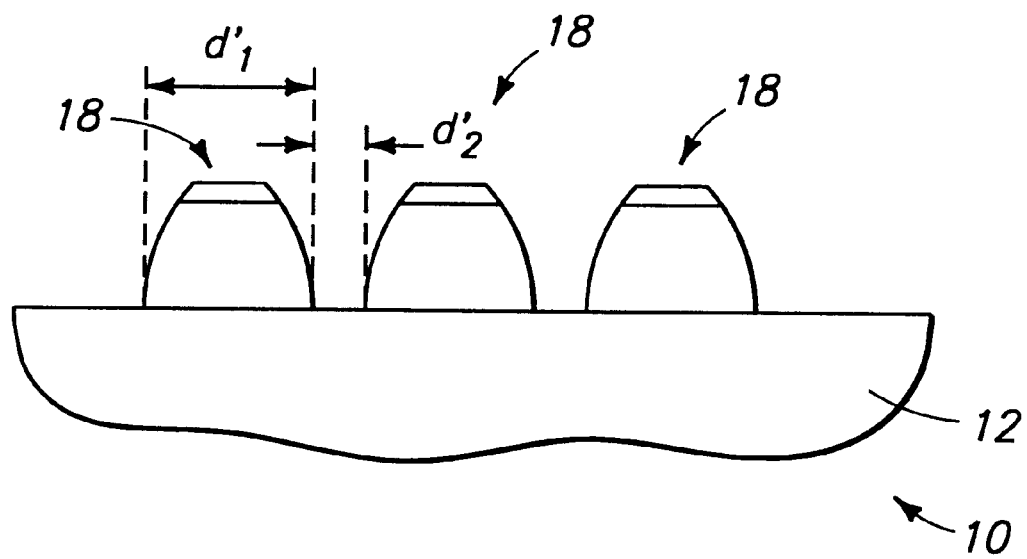
FIG. 3 is a view of the FIG. 1 wafer fragment at a processing step subsequent to that shown by FIG. 2.
Figure 4:
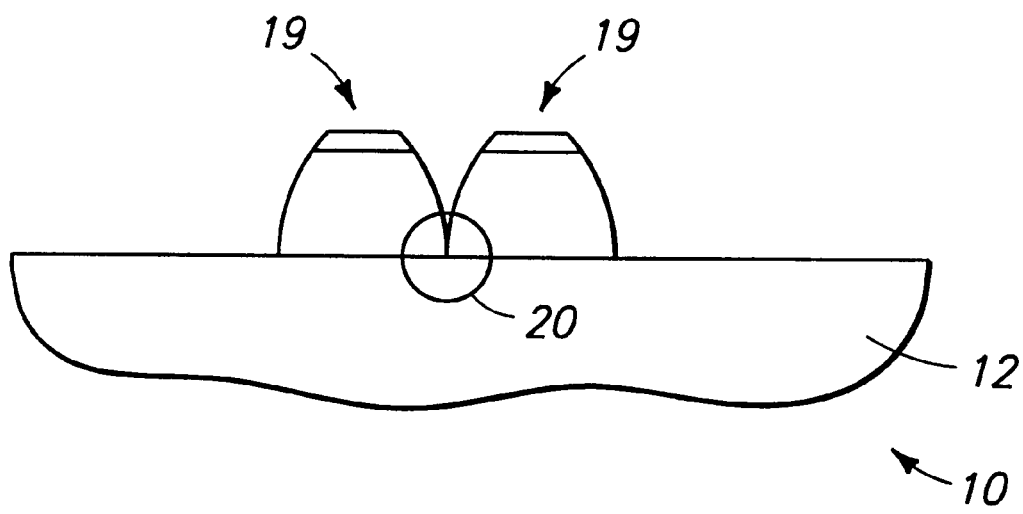
FIG. 4 is a view of the FIG. 1 wafer fragment at a processing step subsequent to that shown by FIG. 3.
Figure 5:
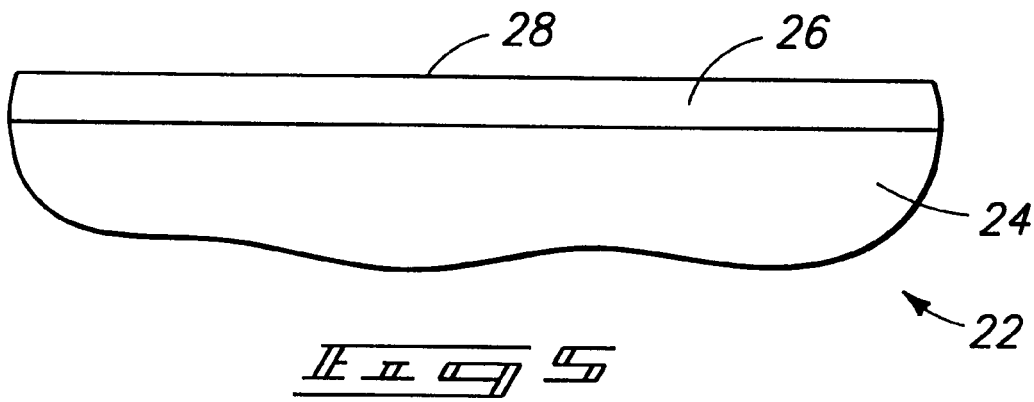
FIG. 5 is a diagrammatic sectional view of a semiconductor wafer fragment at one processing step in accordance with the invention.

Referring to FIG. 5, a semiconductor wafer fragment, in process, is shown generally at 22 and includes substrate 24. Substrate 24 can constitute a semiconductive substrate or an insulative substrate. A refractory metal layer 26 is formed over substrate 24 and includes an outer exposed surface 28. An exemplary and preferred material for layer 26 is titanium. Other refractory metal materials can, of course, be utilized. An exemplary thickness for layer 26 is about 300 Angstroms.

Figure 6:
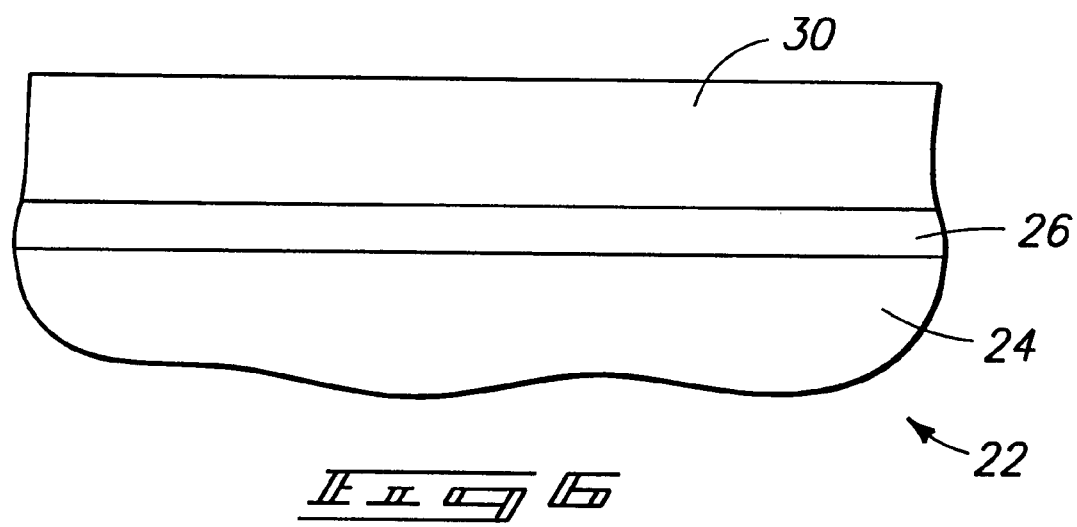
FIG. 6 is a view of the FIG. 5 wafer fragment at a processing step subsequent to that shown by FIG. 5.

Referring to FIG. 6, a silicon-containing layer 30 is formed over outer surface 28 of refractory metal layer 26. An exemplary thickness for layer 30 is about 1100 Angstroms.

Referring to FIG. 7, layer 30 is patterned and etched into a plurality of silicon-containing structures 32 over the substrate. Individual structures 32 have respective outer surfaces 34. Individual outer surfaces 34 are, in the illustrated example, defined by respective structure tops 36, and respective structure sidewalls 38. Adjacent structures have respective sidewalls which face one another. Individual structures 32 also include respective silicon-containing portions 40 which are disposed proximate refractory metal layer outer surface 28. In a preferred implementation, silicon-containing structures 32 have structure dimensions $d_1"$, and adjacent silicon-containing structures 32 constitute respective pairs of structures having first lateral separation distances or spacings $d_2"$ (illustrated for the left-most pair of structures). In accordance with this implementation, $d_1"$ and $d_2"$ are no greater than about 0.35 µm.

Referring to FIG. 8, substrate 24 is exposed to conditions which are effective to form silicon diffusion restricting layers 42 over at least some of the silicon-containing portions 40 proximate outer surface 28 of the refractory metal layer 26. Preferably, the silicon diffusion restricting layers 42 cover the entirety of the individual silicon-containing structures 32 and are formed to a relative thickness of no less than about 10 Angstroms. Even more preferably, the thickness of layers 42 is between about 10 to 20 Angstroms. Accordingly, the respective sidewalls of the individual structures 32 are covered with respective silicon diffusion restricting layers. According to another aspect of the invention, the conditions which are effective to form silicon diffusion restricting layers 42 are also effective to form silicon diffusion restricting layers or regions 44 over or within refractory metal layer 26. Exemplary and preferred elevational thicknesses of layers 44 are less than or equal to about 50 Angstroms. Accordingly, layers 42 constitute first silicon diffusion restricting structures or layers and layers/regions 44 constitute second silicon diffusion restricting structures or layers.

In a preferred implementation, the silicon-containing structures 32 and the refractory metal layer surface 28 are exposed to nitridizing conditions in a common step. Such conditions are preferably effective to cover the respective silicon-containing structures with nitride-containing material (layers 42) such as silicon nitride, and form nitride-containing material layers 44 within the refractory metal layer between the silicon-containing structures. In this implementation, nitride-containing material layers 44 constitute a refractory metal nitride compound such as $TiN_x$, with titanium being a preferred refractory metal material as mentioned above. Exemplary and preferred nitridizing conditions in a cold wall reactor comprise a low pressure (about 1 Torr), low temperature $N_2/H_2$ atomic plasma at a reactor power of 200 Watts to 800 Watts. Flow rates are respectively about 100 to 300 sccm for $N_2$ and 450 sccm for $H_2$. Addition of $H_2$ into $N_2$ plasma reduces if not eliminates oxidation of the exposed refractory metal surface. Suitable temperature conditions for such nitridizing include temperatures between about 250° C. to 450° C., with temperatures between 375° C. and 400° C. being preferred. Preferred exposure times under such conditions range between 30 to 60 seconds. The above processing conditions are only exemplary and/or preferred processing conditions. Accordingly, other processing conditions or deposition techniques are possible.

Figure 9:
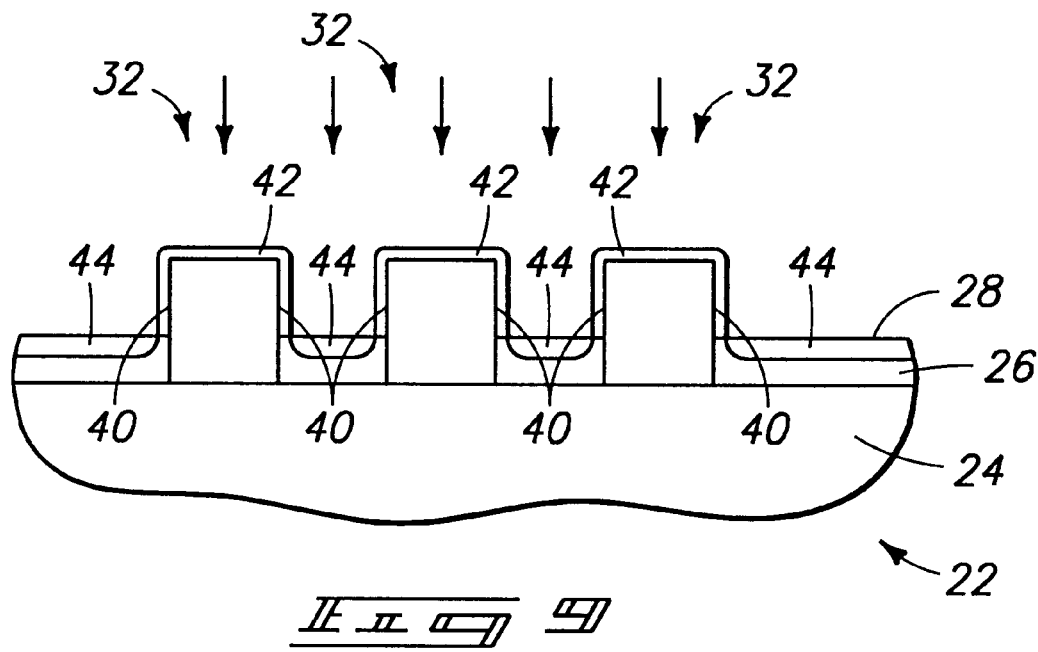
FIG. 9 is a view of the FIG. 5 wafer fragment at a processing step subsequent to that shown by FIG. 8.
Figure 10:
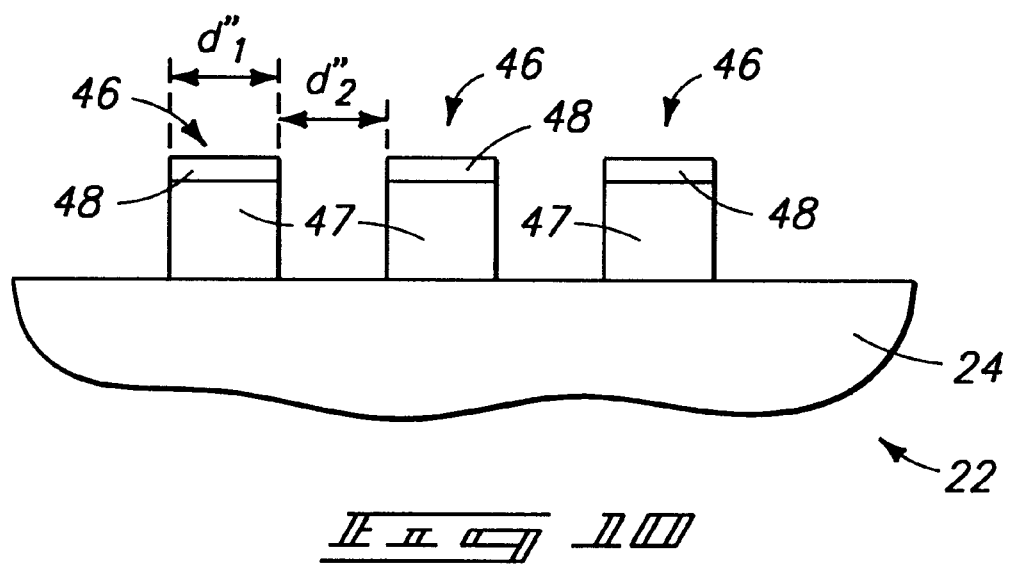
FIG. 10 is a view of the FIG. 5 wafer fragment at a processing step subsequent to that shown by FIG. 8.

Referring to FIGS. 9 and 10, and after the formation of the above described silicon diffusion restricting layers, substrate 24 is annealed to a degree sufficient to react at least some of the material of the silicon-containing structures with at least some of the refractory metal material. FIG. 9 shows an intermediate substrate construction during such annealing thereof. Suitable processing conditions include a temperature of about 675° C. for about 40 seconds in $N_2$. Accordingly, such forms respective refractory metal silicide components 46. Silicide components 46 can include respective silicide portions 47 and unreacted silicon portions 48. After forming components 46, substrate 24 can be subjected to a stripping step comprising a mix of ammonia and peroxide. In a preferred implementation, such refractory metal silicide components constitute conductive lines which electrically interconnect various integrated circuitry devices or portions thereof. In an exemplary and preferred implementation, components 46 constitute at least a portion of a local interconnect for a static random access memory cell. In the illustrated example, the silicon diffusion restricting layers are effective to restrict silicon lateral diffusion during the annealing step just mentioned. Accordingly, with silicon surface and other diffusion reduced, if not eliminated, the respective silicide components 46 have a second lateral distance or spacing $d_2"$ therebetween which is substantially the same as the FIG. 7 first lateral distance or spacing $d_2"$. In processing regimes where a critical dimension of 0.35 µm is a design rule, such second lateral distance would be about 0.35 µm. Accordingly, line dimensions $d_1"$ are substantially equal to lateral distance or spacing $d_2"$ and do not meaningfully varying from the FIG. 7 pre-annealing dimensions or spacings.

The above described methodology enables refractory silicide components to be formed which are substantially free from lateral silicon diffusion during salicidation. Thus, closer relative spacing of such components can be achieved with risks associated with grounding or shorting of the components reduced.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a refractory metal silicide component comprising:

forming a refractory metal layer over a substrate, the refractory metal layer having an exposed surface;

forming a silicon-containing structure over a portion of the exposed surface of the refractory metal layer, the silicon-containing structure having an outer surface, the outer surface having a surface portion proximate the refractory metal layer;

forming a silicon diffusion restricting layer over at least some of the proximate surface portion and a silicon diffusion restricting region within the refractory metal layer; and after forming the silicon diffusion restricting layer and the silicon diffusion restricting region, annealing the substrate to cause a silicide forming reaction between at least some of the refractory metal layer and at least some of the silicon-containing structure.

2. The method of claim 1, wherein the forming of the silicon diffusion restricting layer comprises forming the layer over the entirety of the proximate surface portion.

3. The method of claim 1, wherein the forming of the silicon diffusion restricting layer comprises forming the layer to have a relative thickness of no less than about 10 Angstroms.

4. The method of claim 1, wherein the forming of the silicon diffusion restricting layer comprises forming the layer to have a relative thickness of between about 10 to 20 Angstroms.

5. The method of claim 1, wherein the forming of the silicon diffusion restricting layer comprises exposing the substrate to temperature conditions of between about 250° C. to 450° C. in the presence of nitrogen.

6. The method of claim 5, wherein the exposing of the substrate comprises exposing the substrate to atomic nitrogen and atomic hydrogen.

7. The method of claim 6, wherein the atomic nitrogen and the atomic hydrogen comprise an atomic plasma.

8. The method of claim 1, wherein the forming of the silicon diffusion restricting layer comprises exposing the substrate to temperature conditions of between about 375° C. to 400° C. in the presence of nitrogen.

9. The method of claim 1, wherein the refractory metal silicide component comprises a conductive line which constitutes at least a portion of a local interconnect for a static random access memory cell.

10. A method of forming a refractory metal silicide component comprising:

forming a refractory metal layer over a substrate, the refractory metal layer having an outer surface;

forming a silicon-containing structure over a portion of the refractory metal layer outer surface, the silicon-containing structure having a silicon-containing portion proximate an exposed portion of the refractory metal layer outer surface;

forming a silicon diffusion restricting layer over the silicon-containing portion and a silicon diffusion restricting region within the exposed portion of the refractory metal layer; and after forming the silicon diffusion restricting layer and silicon diffusion restricting region, annealing the substrate to cause a reaction between at least some of the refractory metal layer and at least some of the silicon-containing structure to at least partially form a refractory metal silicide component.

11. The method of claim 10, wherein the forming of the silicon-containing structure comprises:

forming a layer comprising silicon over the refractory metal layer outer surface; and etching the layer to define the silicon-containing structure having a sidewall at least a portion of which constitutes the silicon-containing portion proximate the refractory metal layer outer surface.

12. The method of claim 10, wherein the forming of the silicon diffusion restricting region comprises forming the region to have a elevational thickness within the refractory metal layer less than or equal to about 50 Angstroms.

13. The method of claim 10, wherein the forming of the silicon diffusion restricting layer comprises forming the layer to have a thickness over the silicon-containing portion of between about 10 to 20 Angstroms.

14. The method of claim 10, wherein the forming of the silicon-containing structure comprises:

forming a layer comprising silicon over the refractory metal layer outer surface; and etching the layer to define the silicon-containing structure having a sidewall at least a portion of which constitutes the silicon-containing portion proximate the refractory metal layer outer surface; and wherein the forming of the silicon diffusion restricting layer and the silicon diffusion restricting region comprises forming the layer and the region in a common step, the region to have an elevational thickness within the refractory metal layer of about 50 Angstroms, and the layer to have a thickness over the silicon-containing portion of between about 10 to 20 Angstroms.

15. The method of claim 10, wherein the forming of the silicon-containing structure comprises:

forming a layer comprising silicon over the refractory metal layer outer surface; and etching the layer to define the silicon-containing structure having at least one sidewall at least a portion of which constitutes the silicon-containing portion proximate the refractory metal layer outer surface; and wherein the forming of the silicon diffusion restricting layer comprises forming the restricting layer over the entirety of the silicon-containing line.

16. The method of claim 10, wherein the forming of the silicon diffusion restricting layer comprises exposing the substrate to temperature conditions of between about 250° C. to 450° C. and in the presence of nitrogen and forming a silicon diffusion restricting layer over the silicon-containing portion comprising silicon nitride and having a relative thickness of between about 10 to 20 Angstroms.

17. A method of forming a refractory metal silicide component comprising:

forming a refractory metal layer over a substrate;

forming a silicon-containing layer over the refractory metal layer;

etching the silicon-containing layer to form a silicon-containing structure over the refractory metal layer;

forming a nitride-containing layer over at least some of the silicon-containing structure;

forming a refractory metal nitride region within the refractory metal layer proximate the silicon-containing structure; and annealing the substrate sufficiently to at least partially form a refractory metal silicide component proximate the silicon-containing structure.

18. The method of claim 17, further comprising forming a refractory metal nitride region within the refractory metal layer proximate the silicon-containing structure, wherein the forming of the nitride-containing layer and the forming of the refractory metal nitride region comprise a common step.

19. The method of claim 17, further comprising forming a refractory metal nitride region within the refractory metal layer proximate the silicon-containing structure, wherein the forming of the nitride-containing layer and the forming of the refractory metal nitride region comprise a common step, the common step comprising exposing the substrate to temperature conditions between about 250° C. to 450° C. in the presence of nitrogen and for a duration sufficient to:

form a nitride-containing layer to a thickness of about 10 to 20 Angstroms; and form a refractory metal nitride compound having an elevational thickness of about 50 Angstroms.

20. A method of forming a plurality of refractory metal silicide components comprising:

providing a substrate;

forming a refractory metal layer over the substrate;

forming a silicon-containing layer over the refractory metal layer;

etching the silicon-containing layer to form at least two distinct silicon-containing structures having respective sidewalls which face one another and define a first lateral spacing therebetween;

forming a silicon diffusion restricting layer over the structures' respective sidewalls;

forming a refractory metal nitride region received within the refractory metal layer between the two silicon-containing structures; and annealing the substrate sufficiently to at least partially form respective refractory metal silicide components having a second lateral spacing therebetween which is substantially the same as the first lateral spacing.

21. The method of claim 20, wherein the forming of the silicon diffusion restricting layer and the forming of the refractory metal nitride region comprise at least one common step.

22. The method of claim 20, wherein the forming of the silicon diffusion restricting layer comprises exposing the substrate to temperature conditions in the presence of nitrogen sufficient to form a silicon diffusion restricting layer comprising silicon nitride.

23. The method of claim 20, wherein the forming of the silicon diffusion restricting layer and the forming of the refractory metal nitride region comprise at least one common step, and the forming of the silicon diffusion restricting layer comprises exposing the substrate to temperature conditions in the presence of nitrogen sufficient to form a silicon diffusion restricting layer comprising silicon nitride and having a thickness of between about 10 to 20 Angstroms.

24. The method of claim 20, wherein the forming of the silicon diffusion restricting layer and the forming of the refractory metal nitride region comprise at least one common step, and the forming of the refractory metal nitride region comprises exposing the substrate to temperature conditions in the presence of nitrogen sufficient to form the region to a thickness of about 50 Angstroms.

25. A method of forming a pair of refractory metal silicide components comprising:

forming a layer comprising silicon over a refractory metal material having an exposed surface;

etching a pair of silicon-containing structures from the layer comprising silicon, the structures having a lateral separation distance relative to one another of no greater than about 0.35 µm;

exposing the silicon-containing structures and the refractory metal material surface to nitridizing conditions effective to cover the pair of silicon-containing structures with nitride-containing material, and form nitride-containing material within the refractory metal material between the silicon-containing structures; and after the exposing, reacting at least some of the silicon-containing structures with at least some refractory metal material to at least partially form respective refractory metal silicide components having lateral separation distances of no greater than about 0.35 µm.

26. The method of claim 25, wherein the refractory metal material comprises titanium.

27. The method of claim 25, wherein the exposing comprises:

covering the pair of silicon-containing structures with silicon nitride to a thickness of about 10 to 20 Angstroms; and forming the nitride-containing material within the refractory metal material to a thickness of about 50 Angstroms.

28. A method of restricting silicon surface migration of an etched silicon structure relative to a surface of an underlying refractory metal layer comprising:

in at least one common step, exposing the silicon structure and the refractory metal layer to nitridizing conditions effective to form a layer of silicon nitride over the silicon structure, and a refractory metal nitride region received within the refractory metal layer; and after the common exposing step, exposing the silicon structure and the refractory metal layer to conditions effective to at least partially form a refractory metal silicide component.

29. The method of claim 28, wherein the exposing of the silicon structure to nitridizing conditions forms the silicon nitride layer over the entirety of the silicon structure.

30. The method of claim 28, wherein the exposing of the silicon structure and the refractory metal layer to nitridizing conditions is effective to form the silicon nitride layer to a thickness of between about 10 to 20 Angstroms and form the refractory metal nitride to a thickness of about 50 Angstroms.

31. The method of claim 28, wherein the refractory metal layer comprises a titanium layer.

32. The method of claim 28, wherein the refractory metal layer comprises a titanium layer and the exposing of the silicon structure and the titanium layer to nitridizing conditions is effective to form the silicon nitride layer to a thickness of between about 10 to 20 Angstroms and form $TiN_x$ within the titanium layer to a thickness of about 50 Angstroms.

33. The method of claim 28, wherein the exposing of the silicon structure and the refractory metal layer to nitridizing conditions comprises exposing the same to temperature conditions between about 250° C. and 450° C. for a duration effective to form the silicon nitride layer to a thickness of between about 10 to 20 Angstroms and form the refractory metal nitride region to a thickness of about 50 Angstroms.

34. The method of claim 28, wherein the refractory metal layer comprises a titanium layer and the exposing of the silicon structure and the titanium layer to nitridizing conditions comprises exposing the same to temperature conditions between about 250° C. and 450° C. for a duration effective to form the silicon nitride layer to a thickness of between about 10 to 20 Angstroms and form $TiN_x$ within the titanium layer to a thickness of about 50 Angstroms.

* * * * *